United States Patent [19]

Huang

[11] Patent Number: 5,164,798
[45] Date of Patent: Nov. 17, 1992

[54] DIFFUSION CONTROL OF P-N JUNCTION LOCATION IN MULTILAYER HETEROSTRUCTURE LIGHT EMITTING DEVICES

[75] Inventor: Kuo-Hsin Huang, Sunnyvale, Calif.

[73] Assignee: Hewlett-Packard Company, Palo Alto, Calif.

[21] Appl. No.: 726,319

[22] Filed: Jul. 5, 1991

[51] Int. Cl.$^5$ .................... H01L 29/205; H01S 3/19
[52] U.S. Cl. ........................................ 257/97
[58] Field of Search .................... 357/17, 16

[56] References Cited

U.S. PATENT DOCUMENTS 4,371,967  2/1983  Wada et al. .................... 357/17

Primary Examiner—Jerome Jackson, Jr.

[57] ABSTRACT

A light emitting diode is epitaxially grown on a semiconductor substrate. A lower cladding layer is grown on the substrate and doped to have n-type conductivity. An active layer is deposited on the lower cladding layer, and a p-type upper cladding layer is deposited on the active layer. A relatively thin lower window layer is then deposited on the upper cladding layer, and doped with a first p-type dopant material. A relatively thick upper window layer is then deposited on the lower window layer, and doped with a different p-type dopant material. The layer with a dopant different from the principal portion of the window serves to limit diffusion of dopant through the active layer. The dopant in the diffusion limiting layer can diffuse in both directions, thereby reducing the driving force of diffusion. As a result, the p-type dopant intersects a steep portion of the concentration gradient of n-type dopant quite near the interface between the lower cladding layer and active layer, resulting in high light output power. A diffusion limiting layer having a different dopant than a substrate may be used for forming a LED with a p-type substrate and an n-type layer near the upper face.

16 Claims, 3 Drawing Sheets

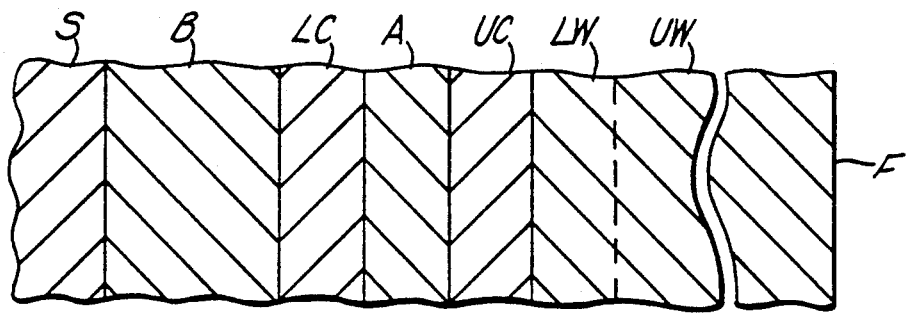
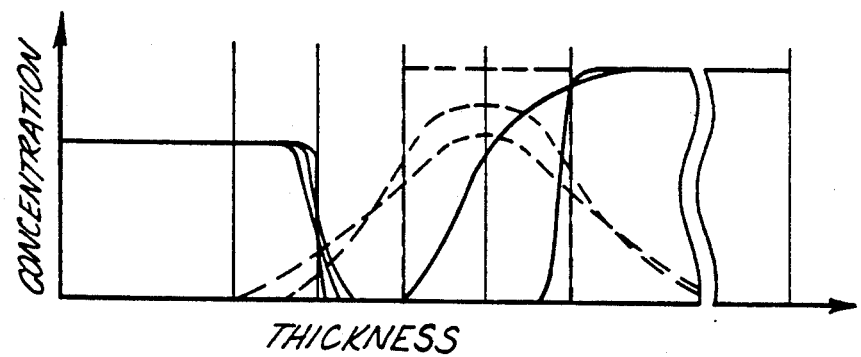
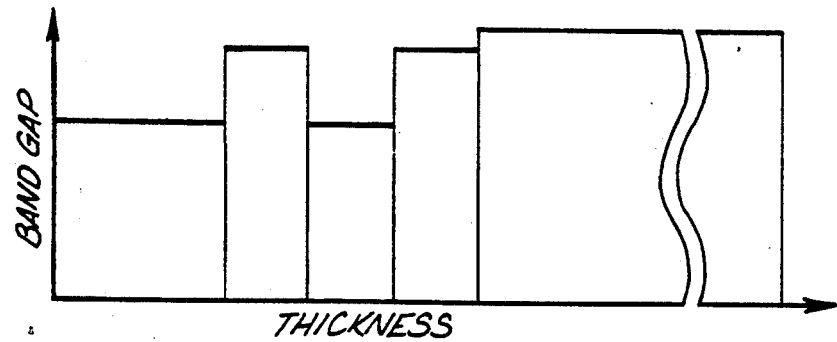

DIFFUSION CONTROL OF P-N JUNCTION LOCATION IN MULTILAYER HETEROSTRUCTURE LIGHT EMITTING DEVICES

BACKGROUND

This invention concerns control of the location of the p-n junction in a double heterostructure light emitting diode (LED) or the like. In particular, it concerns such an LED with a window layer at the light emitting face where diffusion of dopant from a portion of the window layer is separated from the p-n junction. The invention also concerns an LED made with a p-type substrate.

LEDs have become ubiquitous devices in a broad variety of applications, with hundreds of millions of LEDs being produced annually. A large proportion of these LEDs emit red light. It is desirable, however, to have yellow and green hues as well. A semiconductor material useful for such LEDs comprises a III-V compound, aluminum indium gallium phosphide, AlInGaP, where by varying the composition, the wave length of light emitted by the LED may be varied.

A typical technique for making an AlInGaP double heterostructure LED employs MOCVD (metalo-organic chemical vapor deposition). A substrate of n-type gallium arsenide is commonly employed. A buffer layer with a gradual change in composition from the composition of the substrate to the composition of the active layers is epitaxially grown on the substrate. Three layers of AlInGaP are then epitaxially grown on the buffer layer. The three layers are referred to as the lower cladding layer on the buffer layer, which is typically doped with tellurium to be n-type, an active layer of a different composition which is deposited without appreciable doping, and an upper cladding layer which is typically doped with magnesium or zinc, or sometimes beryllium or carbon.

One problem with this type of structure is that the electrical conductivity of the upper cladding layer (upper referring to the portion of the LED more remote from the "lower" GaAs substrate) is relatively low. It is therefore desirable to epitaxially grow a window layer on top of the upper cladding layer. The window layer has a relatively high conductivity so that current from an opaque electrode on the upper face of the LED spreads laterally so that light is emitted from areas that are not blocked by the electrode. The refractive index of the window is selected so that it enhances the amount of light emitted from the LED. A high conductivity material such as GaP doped with magnesium or zinc to be p-type may be used. Such a window is described in U.S. Pat. No. 5,008,718.

To enhance these effects, it is desirable to have a relatively thick window, for example, from 20 to 100 micrometers. It takes from 1.5 to 8 hours to grow a window of such thickness by VPE at a temperature of 800° C. This may result in substantial diffusion of the dopant from the upper cladding layer and window through the active layer. When a relatively thick window is grown, diffusion of the p-type dopant may extend an appreciable distance into the lower cladding layer.

FIG. 1 illustrates schematically the concentration of dopant (e.g., magnesium) in the cladding layers and active layer after growing windows in the order of 2, 20 and 60 micrometers. For a very thin window, the p-n junction is near the interface of the active layer A and the upper cladding layer UC. For a window of moderate thickness, the p-n junction is near the boundary between the active layer and the lower cladding layer LC. For a thick layer, however, the p-n junction is deep within the lower cladding layer.

The problem with this is illustrated in the schematic illustration of FIG. 2 which shows light output power (in arbitrary units) as a function of the position of the p-n junction. The light output power drops off rapidly in the lower cladding layer since this is an indirect band gap material with few recombination centers, whereas the active layer is a direct band gap material. It is readily apparent that the maximum light output power as a function of current through the LED is achieved when the p-n junction is approximately coincident with the interface between the active and lower cladding layers.

It is therefore desirable to provide a technique whereby the p-n junction can be maintained in this position.

BRIEF SUMMARY OF THE INVENTION

There is, therefore, provided in practice of this invention according to a presently preferred embodiment a method for forming an LED having a lower cladding layer, active layer and upper cladding layer deposited successively on a semiconductor substrate. A relatively thin lower window layer deposited on the upper cladding layer is doped with a first dopant material. A relatively thicker upper window layer is then deposited on the lower window layer, with the upper window layer having a different dopant material than the lower window layer.

This results in the driving force for diffusion of the first dopant material decreasing appreciably as a thicker layer is grown and the maximum concentration of the dopant is decreased. In effect, the supply of dopant for diffusion is depleted. As a result, the p-n junction remains on the steep portion of the concentration gradient of the dopant in the lower cladding layer. The p-n junction lies quite near the interface between the active and lower cladding layers.

In a specific embodiment, such a light emitting diode has a gallium arsenide substrate, and a lower cladding layer of n-type aluminum indium gallium phosphide, with a buffer layer having a graded composition between the substrate and the lower cladding layer. An active layer and upper cladding layer of aluminum indium gallium phosphide are deposited successively on the lower cladding layer. The upper cladding layer is doped, for example, with magnesium. A relatively thick window layer of gallium phosphide is formed on the upper cladding layer. The window has two different dopants. A first relatively thin layer, adjacent to the upper cladding layer, typically has the same dopant as the upper cladding layer to serve as a diffusion limiting layer. A second relatively thicker layer has a second dopant.

Such a diffusion limiting layer may also be used for forming a light emitting diode on a p-type substrate. A lower cladding layer is deposited on the substrate and an active layer is deposited on the lower cladding layer. An upper cladding layer is deposited on the active layer and doped to have a conductivity type different from the conductivity type of the lower cladding layer. A diffusion limiting layer adjacent to the lower cladding layers has a dopant for providing the same conductivity type as the lower cladding layer and a generally bell-shaped distribution of dopant concentration normal to the interface between the cladding layer and the active layer.

BRIEF DESCRIPTION OF THE DRAWINGS

These and other features and advantages of the present invention will be appreciated as the same becomes better understood by reference to the following detailed description when considered in connection with the accompanying drawings wherein:

FIG. 3 illustrates in FIG. 3a a fragmentary transverse cross section of an LED constructed according to principles of this invention, in FIG. 3b the concentration schematically of dopant in an LED as illustrated in FIG. 3a, and in FIG. 3c the band gap of various layers in the LED of FIG. 3a.

DETAILED DESCRIPTION

Figure 1:
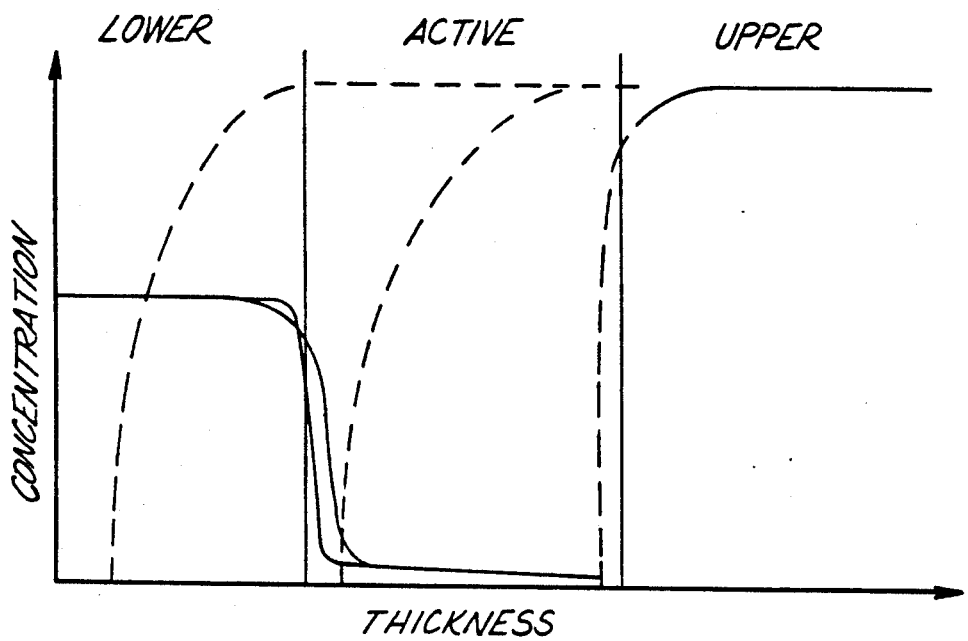
FIG. 1 illustrates schematically a transverse cross section of a prior art light emitting diode adjacent to the active layer.
Figure 2:
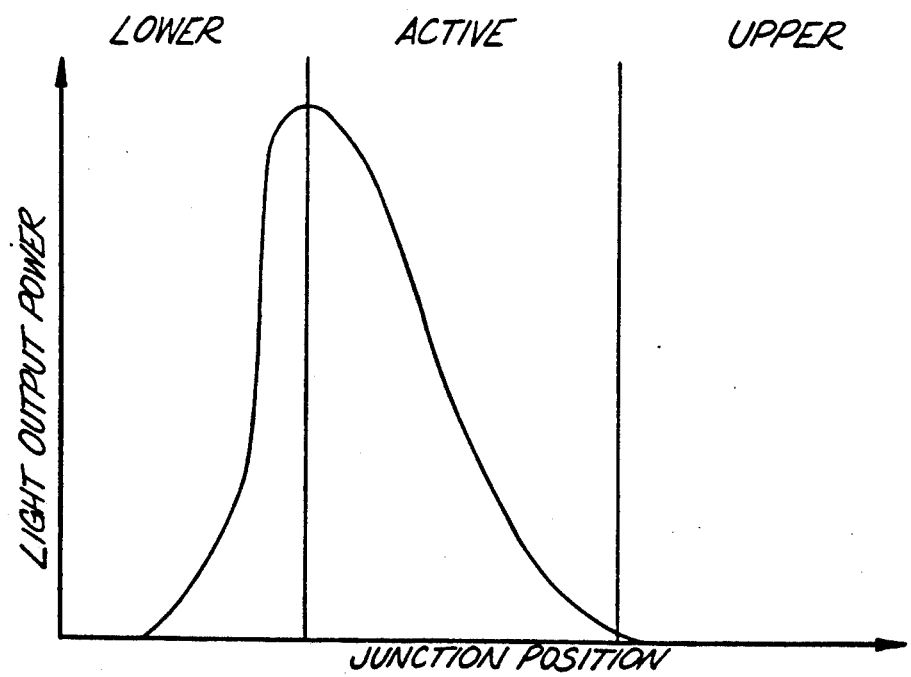
FIG. 2 illustrates schematically the light output power as a function of junction position in such an LED.

A representative light emitting diode (LED) is grown on a single crystal substrate S of gallium aresenide with tellurium to be of n-type. The LED may be a single device on a small gallium arsenide chip, or one of a number of LEDs on a somewhat larger gallium arsenide chip.

First, a buffer layer B is epitaxially grown on the GaAs substrate. The composition of the buffer layer is gradually changed from the composition of the substrate to the composition of an overlying lower cladding layer LC. A typical thickness of the buffer layer is in the order of 1.5 micrometers.

The lower cladding layer is typically aluminum indium gallium phosphide and has a thickness in the order of 1 micrometer. The lower cladding layer, buffer layer and substrate are doped with a n-type dopant such as tellurium at a concentration of up to $5 \times 10^{17}$. This is about the maximum useable concentration of tellurium, and is used to give a high electrical conductivity.

An active layer A is epitaxially grown on the lower cladding layer. Typically, the active layer is an aluminum indium gallium phosphide having a composition different from the lower cladding layer and essentially undoped. The band gap of the active layer is somewhat less than the band gap of the lower cladding layer, as can be seen in the schematic illustration of FIG. 3c. Furthermore, the active layer is a direct band gap material as contrasted with the tellurium doped AlInGaP lower cladding layer which is an indirect band gap material. A typical thickness for the active layer is about 1 micrometer.

An upper cladding layer UC is epitaxially grown on the active layer. The upper cladding layer has an aluminum indium gallium phosphide composition similar to that of the lower cladding layer. It is, however, doped with a p-type dopant such as magnesium. To achieve the maximum conductivity, the dopant is present in the range of from 1 to $2 \times 10^{18}$. A typical thickness of the upper cladding layer is also 1 micrometer.

These layers are deposited on the substrate by conventional metalo-organic chemical vapor deposition (MOCVD). Although the exemplary embodiment has a double heterostructure of AlInGaP, suitable LEDs may also be made from other III-V compositions such as aluminum indium phosphide. The wavelength of the light emitted from the LED is a function of the composition, as is well known.

A relatively thick window layer is then epitaxially grown on the upper cladding layer. Typically, the window layer comprises gallium phosphide or other suitable material having a higher band gap than the active layer so as to be transparent to the light emitted from the p-n junction of the LED. As mentioned above, the window maximizes useful light output and provides current spreading for maximizing the area of the junction from which light is emitted.

In the exemplary embodiment, the window has a relatively thin lower window layer LW adjacent to the upper cladding layer. A relatively thicker upper window layer UW extends to the upper or front face F of the LED. Typically, the lower window layer has a thickness in the range of from about 1 to 1.5 micrometers. The total thickness of the window layer may be from 20 to 100 micrometers, for example, 50 micrometers.

The lower window layer is doped with a p-type dopant which is preferably the same p-type dopant as in the upper cladding layer. The balance of the window layer is doped with a p-type dopant different from the dopant in the lower window layer. Thus, for example, the lower window layer may be doped with magnesium and the upper window layer doped with zinc. The concentration of each of these dopants is in the range of from 1 to $2 \times 10^{18}$. It is convenient to deposit the lower window layer by MOCVD. The upper window layer is preferably deposited by vapor phase epitaxial growth (VPE) which is capable of depositing thick layers of GaP.

The concentrations of dopants are mentioned above as if there were no diffusion or migration during deposition. As a matter of fact, diffusion does occur at the elevated temperatures required for MOCVD and VPE. The diffusivity of the n-type dopant tellurium is relatively low and there is a steep concentration gradient of tellurium adjacent the interface between the lower cladding layer LC and the active layer A, as indicated by the solid lines near the left of FIG. 3b. Three slightly S-shaped curves are shown, with the steepest being characteristic of concentration of tellurium if a thin window layer (e.g., 2 micrometers) is deposited. The least steep curve is characteristic of the concentration gradient for a thick window, e.g., 60 micrometers. The intermediate curve is characteristic of a window of intermediate thickness, e.g., 20 micrometers.

At the right side of FIG. 3b, there are two solid line concentration curves commencing in the upper window layer. The relatively steeper curve indicates the distribution of dopant from the upper window layer (e.g., zinc) when a window of intermediate thickness is deposited. The less steep curve indicates the concentration gradient of upper window layer dopant for a relatively thicker window layer such as 60 micrometers. It will be noted that despite the relatively high diffusivity of the p-type dopant, the diffused zinc has not reached the n-type tellurium dopant.

In the mid-portion of FIG. 3b, the concentration of magnesium is indicated with dashed lines. When the magnesium is included in the upper cladding layer and lower window layer as deposited, it is present as essentially a rectangular step function or "pulse". In that situation, the p-n junction of the LED is rather near the interface between the active layer and the upper cladding layer (the active layer, although nominally undoped, is typically slightly n-type).

The magnesium in the upper cladding layer and lower window layer tends, however, to diffuse laterally from those layers into the active layer on one side and into the upper window layer on the other side. The upper dashed curve indicates schematically the distribution or concentration gradient of magnesium after a window of intermediate thickness is deposited. The distribution forms a generally bell-shaped concentration curve, with the concentration of dopant decreasing in both directions laterally from a maximum near the center of the "pulse" of magnesium originally deposited. The bell-shaped curve is not necessarily symmetrical since the diffusivity of dopant in the GaP window layer is greater than in the AlInGaP cladding and active layers.

The lowermost dashed curve in FIG. 3B indicates schematically the distribution of dopant from the step function originally deposited, after a thick window such as 60 micrometers has been deposited. Here again, the distribution of dopant is in the form of a generally bell-shaped curve, with dopant diffusing into the upper window layer and through the active layer into the lower cladding layer. It will be noted in both of the bell-shaped curves that the p-type dopant intersects a steep portion of the concentration gradient of the n-type dopant near the interface between the lower cladding layer and the active layer, thereby resulting in high light output power.

The layer of dopant in the upper cladding layer and lower window layer, being different from the dopant in the upper window layer, acts as a limit on diffusion. The diffusion flux J in the LED is $J = D\, dn/dx$, where D is the diffusivity of the dopant in the semi-conductor material and the $dn/dx$ is the concentration gradient of dopant. The diffusivities of magnesium and zinc in AlInGaP at 800° C. are about $1.7 \times 10^{-12}$ and $1.73 \times 10^{-12}$ cm$^2$/sec, respectively.

This means that in the exemplary embodiment where the upper window layer is doped with zinc the p-type dopant profile moves with a speed of about 0.5 micrometers per hour since $dn/dx$ is essentially a constant. There is an essentially unlimited reservoir of zinc driving the diffusion. The magnesium concentration, on the other hand, decreases as diffusion continues since there is a limited amount of magnesium in the "pulse" of magnesium deposited in the semiconductor. As the time of growth and thickness of the window increase, $dn/dx$ becomes smaller and smaller. Thus, the diffusion flux of magnesium or the driving force of magnesium diffusion into the active layer becomes less and less. As a result of this diffusion limiting the layer, the p-n junction remains in the steep part of the concentration gradient for the n-type material near the interface between the active and lower cladding layers.

It has been shown by precision EBIC and SIMS measurements that the p-n junction is fixed at or very close to the interface of the active layer and lower cladding layer for window growth times ranging from 80 minutes to 255 minutes at 800° C. As near as can be determined, there is excellent reproducibility of the location of the p-n junction in the structure.

The thickness of the diffusion limiting layer of a second dopant is sufficient to separate the dopant in the upper window layer from the p-n junction after the entire window is deposited. This can be seen in the solid curves of zinc concentration toward the right in FIG. 3b. In an exemplary embodiment as described and illustrated herein, the original thickness of the diffusion limiting layer (in this case the upper cladding layer plus lower window layer) is about 2.5 micrometers. This is sufficient for separating the advancing zinc from the p-n junction for a window thickness of up to at least 60 micrometers.

In the illustrated embodiment, the original concentration of dopant in the diffusion limiting layer is 1 to $2 \times 10^{18}$ which is about the maximum concentration of magnesium or zinc suitable for an LED. If desired, the original concentration may be somewhat higher so that after diffusion has occurred in both directions from the original deposition as the window layer is deposited, the maximum concentration decreases to a desired level. This helps maintain a maximum electrical conductivity in the active and upper cladding layers.

A similar diffusion limiting layer may be used for forming an LED with a p-type substrate and an n-type material adjacent to the front face. Such LEDs may be desirable in some arrangements where it is desired to reverse the usual direction of current flow. A problem in forming such LEDs by epitaxial growth is that the diffusivity of the p-type dopants is high, and substantial diffusion occurs during deposition of the active and n-type upper cladding layers plus any additional layers added after the upper cladding layer. The effect of the rapid diffusion may be mitigated by using a diffusion limiting layer.

Such an embodiment is illustrated in FIG. 4, where an LED is formed on a p-type substrate S doped with a material such as magnesium. One may grow a diffusion limiting layer DL on the substrate, doped with a different p-type dopant such as zinc. The diffusion limiting layer may be the same material as the substrate, or in the circumstance where there may be a crystal lattice mismatch, the diffusion limiting layer may have a graded composition and serve double duty as a buffer layer. Such a diffusion limiting layer may be included in only a portion of such a buffer layer if desired.

A lower cladding layer LC is deposited on the diffusion limiting layer. Such a lower cladding layer may be doped with a p-type dopant such as zinc which is the same as the dopant in the diffusion limiting layer. If desired alternating layers of magnesium and zinc may be used, however, that does not appear to be required. An active layer A and an upper cladding layer UC are deposited on the lower cladding layer in a conventional manner. The upper cladding layer is suitably doped to be n-type. Additional layers may be deposited on the upper cladding layer if required for a given LED.

Figure 4A:
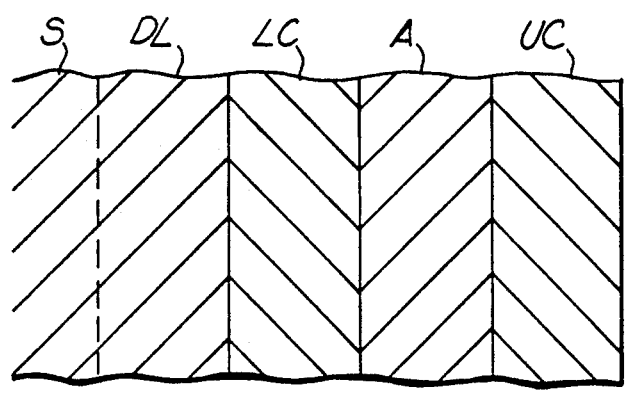
FIG. 4 illustrates schematically a light emitting diode grown on a p-type substrate, with FIG. 4a illustrating a fragmentary transverse cross section of such an LED, and FIG. 4b indicating schematically the distribution of dopant in such an LED.
Figure 4B:
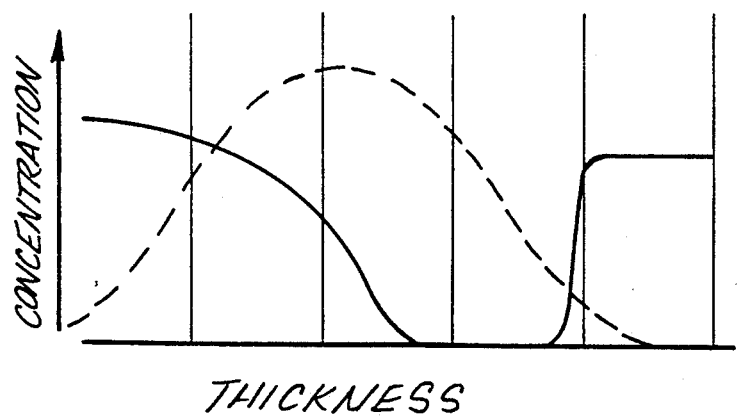

FIG. 4b illustrates schematically the concentration of dopants in the completed LED illustrated in FIG. 4a. As illustrated in the solid curve at the left in FIG. 4b, the p-type dopant (e.g., magnesium) in the substrate diffuses a substantial distance through the diffusion limiting layer and the lower cladding layer, and may even diffuse into the active layer.

The generally bell-shaped dashed curve in FIG. 4b illustrates the distribution of the second dopant material from the diffusion limiting layer and lower cladding layer. This material diffuses in both directions from its original location of deposition, extending through the active layer and also into the substrate.

Finally, the solid curve near the right of FIG. 4b illustrates the concentration of n-type dopant in the upper cladding layer. There is a steep concentration gradient adjacent to the interface between the active layer and upper cladding layer since there is very little diffusion of the n-type dopant. It therefore occurs that the p-n junction, where the p-type material intersects the n-type dopant, is near the interface between the active layer and upper confining layer.

Although limited embodiments of a diffusion limiting layer in light emitting diodes or the like have been described and illustrated herein, many modifications and variations will be apparent to those skilled in the art. In the embodiments illustrated, the second dopant material is deposited in both a cladding layer and the adjacent diffusion limiting layer. To some extent this may be modified by making a relatively thick cladding layer having a different dopant than the adjacent window or substrate so that the cladding layer itself serves as a limit on diffusion. The important feature is that the dopant in the diffusion limiting layer is different from the dopant having a semi-infinite supply so that the diffusion limiting dopant can diffuse in both directions from the diffusion limiting layer. Thus, other modifications and variations may be adopted by those skilled in the art. It will therefore be understood that the invention as defined in the following claims may be practiced otherwise than as specifically described.

What is claimed is:

1. A light emitting diode comprising:
   a substrate;
   a lower cladding layer having a first conductivity type deposited on the substrate;
   an active layer deposited on the lower cladding layer;
   an upper cladding layer deposited on the active layer and doped to have a second conductivity type different from conductivity type of the lower cladding layer; and
   a window layer deposited on the upper cladding layer and doped to have the second conductivity type, the window layer comprising:
      a first layer adjacent to the upper cladding layer having a first dopant material, and
      a second layer remote from the upper cladding layer having a second dopant material; and wherein
   a portion of the dopant material from the first window layer is diffused through the active layer.

2. A light emitting diode as recited in claim 1 wherein the p-n junction of the LED is adjacent to the interface between the active layer and the lower cladding layer.

3. A light emitting diode as recited in claim 1 wherein the concentration of the first dopant has a generally bell-shaped distribution normal to the interface between the upper cladding layer and the active layer.

4. A light emitting diode as recited in claim 1 wherein the window layer has a crystal lattice mismatch with the upper cladding layer.

5. A light emitting diode as recited in claim 1 wherein the lower cladding layer, the active layer and the upper cladding layer comprises aluminum indium gallium phosphide.

6. A light emitting diode comprising:
   a substrate;
   a lower cladding layer having a first conductivity type deposited on the substrate;
   an active layer deposited on the lower cladding layer;
   an upper cladding layer deposited on the active layer and doped to have a second conductivity type different from conductivity type of the lower cladding layer; and
   a window layer deposited on the upper cladding layer and doped to have the second conductivity type, the window layer comprising:
      a first layer adjacent to the upper cladding layer having a first dopant material, the dopant in the first window layer and the dopant in the upper cladding layer being the same material, and
      a second layer remote from the upper cladding layer having a second dopant material.

7. A light emitting diode comprising:
   a gallium arsenide substrate;
   a lower cladding layer having of aluminum indium gallium phosphide having a first conductivity type;
   a buffer layer having a graded composition between the substrate and the lower cladding layer;
   an active layer of aluminum indium gallium phosphide on the lower cladding layer;
   an upper cladding layer of aluminum indium gallium phosphide on the active layer and doped with a first type of dopant to have a second conductivity type different from conductivity type of the lower cladding layer;
   a window layer of gallium phosphide on the upper cladding layer and doped to have the second conductivity type, the window layer comprising:
      a first layer adjacent to the upper cladding layer having a first dopant material, and
      a second layer remote from the upper cladding layer having a second dopant material; and wherein
   a portion of the dopant material from the first window layer is diffused through the active layer.

8. A light emitting diode as recited in claim 7 wherein the thickness of the first window layer and the amount of dopant in the upper cladding layer and the first active layer adjacent to the lower cladding layer after the entire window layer is deposited.

9. A light emitting diode comprising:
   a substrate;
   a lower cladding layer having a first conductivity type deposited on the substrate;
   an active layer deposited on the lower cladding layer;
   an upper cladding layer deposited on the active layer and doped to have a second conductivity type different from conductivity type of the lower cladding layer; and
   a diffusion limiting layer adjacent to one of the cladding layers, the diffusion limiting layer having a dopant for providing the same conductivity type as the adjacent cladding layer and a generally bell-shaped distribution of dopant concentration normal to the interface between the respective cladding layer and the active layer; and wherein
   the end of the bell-shaped distribution extends into the cladding layer on the opposite side of the active layer.

10. A light emitting diode as recited in claim 9 further comprising a layer adjacent to the diffusion limiting layer having a dopant different from the dopant in the diffusion limiting layer but producing the same type of conductivity as the dopant in the diffusion limiting layer.

11. A light emitting diode as recited in claim 10 wherein the layer adjacent to the diffusion limiting layer comprises a substrate on which the LED is epitaxially grown.

12. A light emitting diode as recited in claim 10 wherein the layer adjacent to the diffusion limiting layer comprises a window epitaxially grown on the upper cladding layer.

13. A light emitting diode comprising:
a substrate;
a lower cladding layer having a first conductivity type deposited on the substrate;
an active layer deposited on the lower cladding layer;
an upper cladding layer deposited on the active layer and doped to have a second conductivity type different from conductivity type of the lower cladding layer; and
a diffusion limiting layer adjacent to one of the cladding layers, the diffusion limiting layer having a dopant for providing the same conductivity type as the adjacent cladding layer and a generally bell-shaped distribution of dopant concentration normal to the interface between the respective cladding layer and the active layer, and wherein the bell-shaped concentration curve intersects a steep portion of the concentration gradient of the dopant having the opposite conductivity type.

14. A light emitting diode as recited in claim 9 wherein the dopant in the diffusion limiting layer is the same as the dopant in the adjacent cladding layer.

15. A light emitting diode comprising:
a substrate;
a lower cladding layer comprising aluminum indium gallium phosphide having a first conductivity type deposited on the substrate;
an active layer comprising aluminum indium gallium phosphide deposited on the lower cladding layer;
an upper cladding layer comprising aluminum indium gallium phosphide deposited on the active layer and doped to have a second conductivity type different from conductivity type of the lower cladding layer; and
a window layer deposited on the upper cladding layer and doped to have the second conductivity type, the window layer comprising:
a first layer adjacent to the upper cladding layer doped with magnesium, and
a second layer remote from the upper cladding layer doped with zinc.

16. A light emitting diode comprising:
a gallium arsenide substrate;
a lower cladding layer having of aluminum indium gallium phosphide having a first conductivity type;
a buffer layer having a graded composition between the substrate and the lower cladding layer;
an active layer of aluminum indium gallium phosphide on the lower cladding layer;
an upper cladding layer of aluminum indium gallium phosphide on the active layer and doped with a first type of dopant to have a second conductivity type different from conductivity type of the lower cladding layer;
a window layer of gallium phosphide on the upper cladding layer and doped to have the second conductivity type, the window layer comprising:
a first layer adjacent to the upper cladding layer doped with magnesium, and
a second layer remote from the upper cladding layer doped with zinc.

* * * * *